US007015106B2

(12) United States Patent
Yoon et al.

(10) Patent No.: US 7,015,106 B2
(45) Date of Patent: Mar. 21, 2006

(54) DOUBLE GATE FIELD EFFECT TRANSISTOR AND METHOD OF MANUFACTURING THE SAME

(75) Inventors: Jae-Man Yoon, Seoul (KR); Dong-gun Park, Gyeonggi-do (KR); Gyo-young Jin, Seoul (KR); Yoshida Makoto, Gyeonggi-do (KR); Tai-su Park, Seoul (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 10/917,026

(22) Filed: Aug. 11, 2004

(65) Prior Publication Data

US 2005/0056888 A1 Mar. 17, 2005

(30) Foreign Application Priority Data

Sep. 16, 2003 (KR) ..................... 10-2003-0064153

(51) Int. Cl.
*H01L 21/336* (2006.01)
*H01L 21/00* (2006.01)
*H01L 21/338* (2006.01)

(52) U.S. Cl. ...................... 438/283; 438/157; 438/176

(58) Field of Classification Search ............... 438/283, 438/157, 176, 448, 424
See application file for complete search history.

(56) References Cited

U.S. PATENT DOCUMENTS

| | | | | |
|---|---|---|---|---|
| 6,413,802 | B1 | 7/2002 | Hu et al. | |
| 6,642,090 | B1 * | 11/2003 | Fried et al. | 438/164 |
| 6,706,571 | B1 * | 3/2004 | Yu et al. | 438/157 |
| 6,770,516 | B1 * | 8/2004 | Wu et al. | 438/154 |
| 6,838,322 | B1 * | 1/2005 | Pham et al. | 438/151 |
| 6,858,478 | B1 * | 2/2005 | Chau et al. | 438/149 |
| 2004/0217420 | A1 * | 11/2004 | Yeo et al. | 257/347 |
| 2005/0029583 | A1 * | 2/2005 | Popp et al. | 257/329 |
| 2005/0035415 | A1 * | 2/2005 | Yeo et al. | 257/401 |

FOREIGN PATENT DOCUMENTS

| | | |
|---|---|---|
| EP | 0721221 A2 | 7/1996 |
| KR | 2002-96654 | 12/2002 |
| KR | 2003-26435 | 4/2003 |
| KR | 2003-0065631 | 8/2003 |

OTHER PUBLICATIONS

English language abstract of Korean Publication No. 2003-0065631.

English language Abstract of Korean Patent No. 2002-96654.

English language Abstract of Korean Patent No. 2003-26435.

"A Folded-channel MOSFET for Deepsubtenth Micron Era." 1998 IEEE International Electron Device Meeting Technical Digest, pp. 1032-1034, by Hasimoto et al., and "Sub 50-m FinFET : PMOS," 1999 IEEE International Electron Device Meeting Technical Digest, pp. 67-70 by Heang et al.

* cited by examiner

*Primary Examiner*—Shouxiang Hu
(74) *Attorney, Agent, or Firm*—Marger Johnson & McCollom, P.C.

(57) ABSTRACT

Provided is a double gate field effect transistor and a method of manufacturing the same. The method of manufacturing the double gate field effect transistor comprises forming as many fins as required by etching a silicon substrate, masking the resultant product by an insulating material such as silicon nitride, forming trench regions for device isolation and STI film by using the silicon nitride mask, forming gate oxide films on both faces of the fins after removing the hard mask, and forming a gate line. As such, unnecessary channel formation under the silicon oxide film, when a voltage higher than a threshold voltage is applied to the substrate, is prevented by forming a thick silicon oxide film on the substrate on which no protruding fins are formed.

13 Claims, 7 Drawing Sheets

DOUBLE GATE FIELD EFFECT TRANSISTOR AND METHOD OF MANUFACTURING THE SAME

CROSS REFERENCE TO RELATED APPLICATIONS

This application claims priority from Korean Patent Application No. 2003-64153, filed on Sep. 16, 2003 in the Korean Intellectual Property Office, the disclosure of which is incorporated by reference in its entirety for all purposes.

BACKGROUND OF THE INVENTION

1. Field of the Invention

This disclosure relates to a semiconductor device and a method of manufacturing the same, and more particularly, to a double gate field effect transistor formed on a bulk substrate and a method of manufacturing the same.

2. Description of the Related Art

As the integration density of a semiconductor device increases, the size of a metal-oxide-semiconductor field effect transistor (MOSFET) is miniaturized. For a semiconductor device having a planarized transistor, the miniaturization of a transistor corresponds to a reduction in a channel length of the transistor, thereby improving the performance characteristics, such as an operating speed, of the device.

However, a few problems associated with a reduction of channel length below 100 nm are observed in a conventional MOSFET that includes a planarized transistor. An exemplary problem in this respect is the short distance between a source region and a drain region in the MOSFET. If the source region is too close to the drain region, they interfere with each other and affect, the channel region. To avoid this problem, the concentration degree of a dopant should be increased. As a result, a device characteristic, i.e., an active switching function, which controls the operation of the transistor by controlling the gate voltage of the MOSFET is seriously degraded. This phenomenon is called a short channel effect (SCE). The SCE could degrade the electrical characteristics of the MOSFET, such as instability of subthreshold voltage.

As a solution to solve the SCE problem in the MOSFET, a double gate field effect transistor has been proposed. The double gate field effect transistor has a non-planarized channel structure, and two gates are formed on both faces of the non-planarized channel. That is, the double gate field effect transistor has an advantage of an improved channel control capability because the channel is controlled by the two gates, thereby reducing the SCE problem. Also, when the double gate field effect transistor is in an "on" state by using the two gates, two inversion layers will be formed resulting in more current flowing through the channel.

An example of a fin-type field effect transistor (FinFET) is depicted in the papers "A Folded-channel MOSFET for Deepsubtenth Micron Era," 1998 IEEE International Electron Device Meeting Technical Digest, pp. 1032–1034, by Hasimoto et al., and "Sub 50-nm FinFET: PMOS," 1999 IEEE International Electron Device Meeting Technical Digest, pp. 67–70 by Heang et al., which are hereby incorporated by reference. Referring to the above disclosures, the channel of FinFET is firstly formed on a substrate, and then a source region and drain region of FinFET are formed by using a conventional silicon deposition process.

U.S. Pat. No. 6,413,802 to Hu et. al. discloses a FinFET structure and a method of manufacturing the FinFET, which is formed on a solid silicon epitaxy layer deposited on a silicon on insulator (SOI) substrate or a bulk silicon substrate. The FinFET structure includes a fin as a channel formed vertically to an insulating film, and gates formed on both side surface of the fin. This FinFET structure has an advantage in that a conventional technique for manufacturing a planarized transistor can be applied to form the FinFET using a SOI substrate. Also, the structure has a superior electrical characteristic because the two gates are self aligned not only to each other but also to the source and drain regions. However, this method has some drawbacks since it requires high cost and a long process time for forming the solid epitaxy layer. Also, patterning the channel and source and drain regions to a desired shape is not easy.

Embodiments of the invention address these and other disadvantages of the conventional art.

SUMMARY OF THE INVENTION

Embodiments of the invention provide a double gate field effect transistor formed on a bulk silicon substrate, in which the number of fins may be controlled, where two gates are self aligned to each other and a source and a drain region are also self aligned, and where a channel resistance may be reduced.

Other embodiments of the invention provide a method of manufacturing a double gate field effect transistor that uses a bulk silicon substrate, which can control a number of fins as required, has two gates formed by self aligning, and fins and STI films are also self aligned, having thereby a decreased channel resistance.

BRIEF DESCRIPTION OF THE DRAWINGS

The above and other features and advantages of the invention will become more apparent by describing in detail preferred embodiments thereof with reference to the attached drawings.

DETAILED DESCRIPTION OF THE INVENTION

Figure 1A:
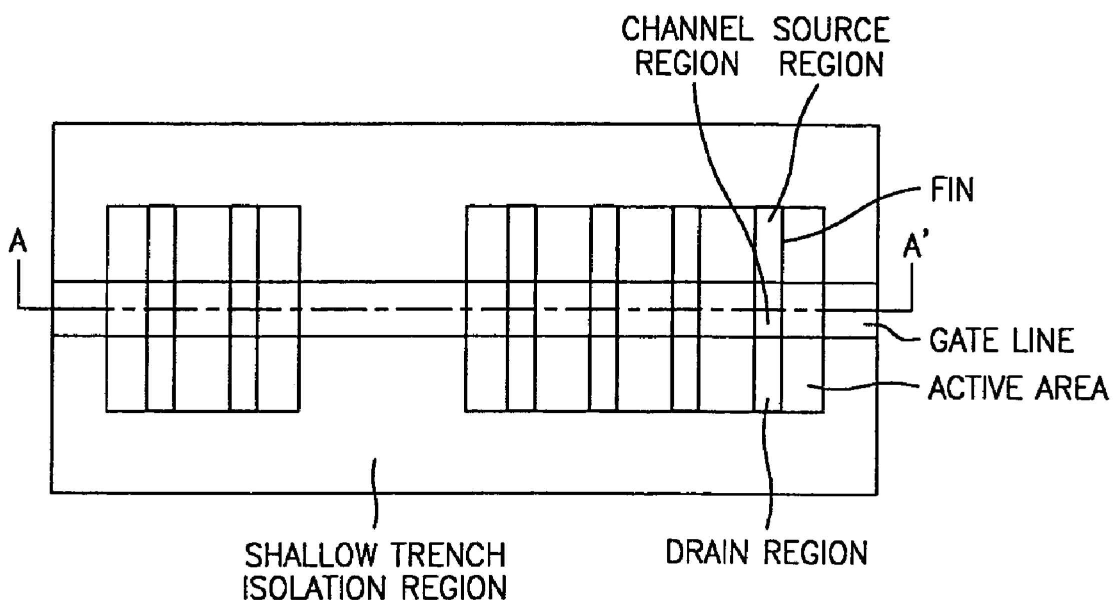
FIG. 1A is a plan diagram illustrating a double gate field effect transistor according to some embodiments of the invention.

Hereinafter, the invention will be described more fully with reference to the accompanying drawings in which preferred embodiments of the invention are shown. This invention may, however, be embodied in many different forms and should not be construed as being limited to the embodiments set forth herein. Rather, these embodiments are provided so that this disclosure is thorough and complete, and fully conveys the concept of the invention to those skilled in the art. In the drawings, the thickness of layers and regions are exaggerated for clarity. To facilitate understanding, identical reference numerals have been used, where possible, to designate identical elements that are common to the figures.

FIG. 1A is a plan diagram illustrating a double gate field effect transistor according to some embodiments of the invention.

Figure 1B:
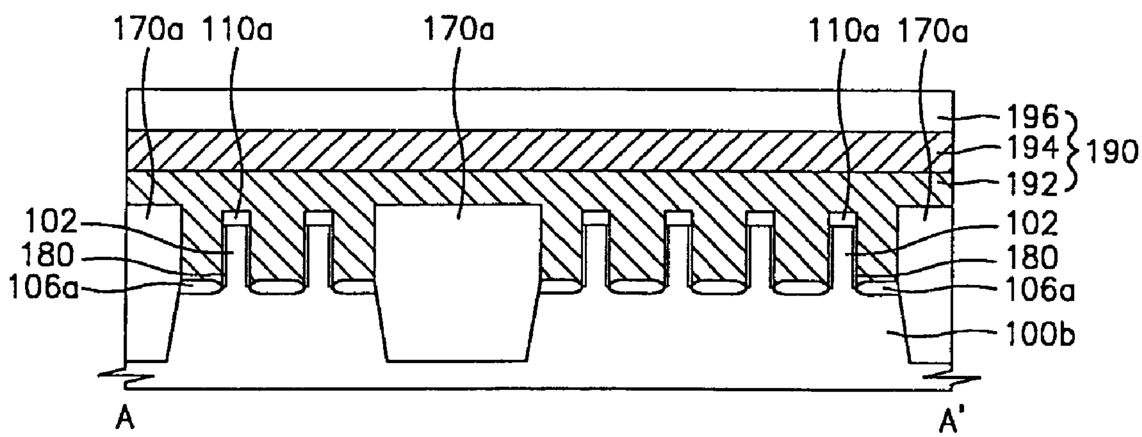
FIG. 1B is a cross-sectional diagram along line A–A' in FIG. 1A.

FIG. 1B is a cross-sectional diagram along line A–A' in FIG. 1A.

Referring to FIGS. 1A and 1B, an active region is defined by shallow trench isolation regions on a bulk substrate, i.e., a bulk silicon substrate 100*b*. An active region pattern can vary according to a number and size of fins to be formed therein. FIG. 1 shows a case where an active region formed in a left side of the drawing has two fins and an active region in a right side has four fins. The number and size of fins can vary according to a type of semiconductor device and a location of a transistor in the device.

Device isolation films such as shallow trench isolation (STI) films 170*a* are formed in the device isolation region. The STI films 170*a* can be formed of a silicon oxide film. An oxide film (not shown) to relieve stress can further be formed between the STI films 170*a* and the bulk silicon substrate 100*b*.

In the active region, protruded fins 102 are formed as parts of the bulk silicon substrate 100*b*, preferably in a longitudinal direction. Each protruded fin 102 formed with a predetermined thickness has an upper face, a first side face, and a second side face. The first and second side faces are self aligned to face each other. A source region and a drain region of a double gate field effect transistor are formed at both edges of each fin without a gate line 190 thereon. A channel region of a double gate field effect transistor is formed on a center portion of the fin 102 having a gate line thereon, i.e., on a portion of fin 102 between the source region and the drain region.

A channel gate oxide film 180 is formed on the first side face and the second side face of the fins 102. The channel gate oxide film 180 can be formed of a silicon thermal oxide film having a thickness in a range of 40~100 Å. An insulating film pattern such as a pad oxide film pattern 110*a* is formed on the upper face of the fin 102. According to a manufacturing process, a height of the STI films 170*a* can be the same as a sum of a height of the fin 102 and the thickness of a pad oxide film pattern 110*a*.

A non-channel gate oxide film 106*a* is formed on the active region of the bulk silicon substrate 100*b* on which no fins are formed. The non-channel gate oxide film 106*a* is formed on the bulk silicon substrate 100*b* under the gate line where channels are not formed. Preferably, the non-channel gate oxide film 106*a* can be formed of a material having a low dielectric constant such as silicon oxide to reduce a parasitic capacitance. Preferably, a thickness of the non-channel gate oxide film 106*a* is formed much thicker than the channel gate oxide film 180. The non-channel gate oxide film 106*a* can be formed of a silicon thermal oxide film having a thickness in a range of 300~500 Å.

Referring to FIGS. 1A and 1B, a gate line 190 used as a gate electrode is formed on the gate oxide film 180 along steps. The gate line 190 with a uniform width is formed horizontally, i.e., perpendicular to a longitudinal direction of the fins 102. That is, the gate line 190 is formed to cover the first and the second side faces of the fins and to extend over the adjacent non-channel gate oxide film 106*a* and the device isolation insulating film 170*a*.

The gate line 190 may include conductive films 192 and 194 as well as a hard mask film 196. The conductive films 192 and 194 may be a layer of poly silicon film and a metal silicide film such as tungsten silicide, respectively. The hard mask film 196 can be formed of an insulating material such as silicon nitride. The conductive film of the gate line 190 can be a single layer.

A method of manufacturing a double gate field effect transistor according to some embodiments of the invention will be described below referring to FIGS. 2 through 18. FIGS. 2 through 18 are cross-sectional diagrams taken along line A–A' in FIG. 1A.

Figure 2:
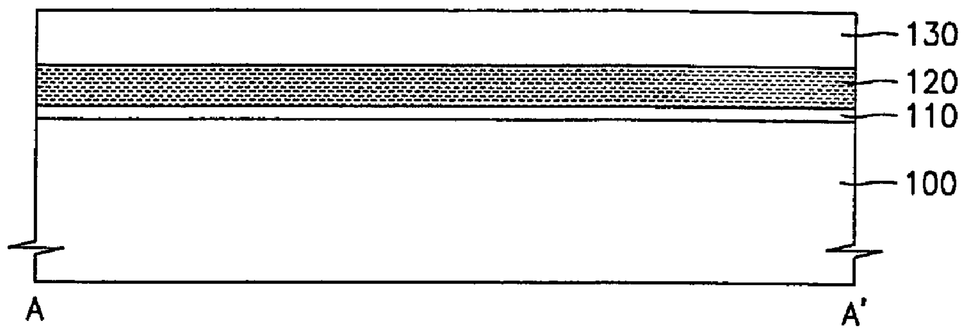
FIGS. 2 through 18 are cross-sectional diagrams illustrating a method of manufacturing a double gate field effect transistor according to some other embodiments of the invention.

Referring to FIG. 2, a pad insulating layer 110, a first hard mask layer 120, and a buffer layer 130 are sequentially formed on a substrate 100. The silicon substrate 100 is a bulk substrate on which active regions are not yet defined by device isolation regions. The pad insulating layer 110, as a buffer layer to relieve stress caused by the first hard mask layer 120, can be formed of a silicon oxide film having a thickness in a range of 150~300 Å. The first hard mask layer 120 is formed on the pad insulating layer 110. Preferably, the first hard mask layer 120 is formed of a material having a large etch selectivity with respect to the pad insulating layer 110 and with respect to the silicon substrate 100 that is used as an etch mask for forming the fins in a following process. The first hard mask layer 120 may be formed of a silicon nitride film having a thickness in a range of 600~1,000 Å. The buffer layer 130 is formed on the first hard mask layer 120 to define a pattern of the fins. When the first hard mask layer 120 is formed of silicon nitride, the buffer layer 130 with a thickness in a range of 800~1,000 Å can be formed of silicon oxide having a large selectivity with respect to the silicon nitride.

Figure 3:
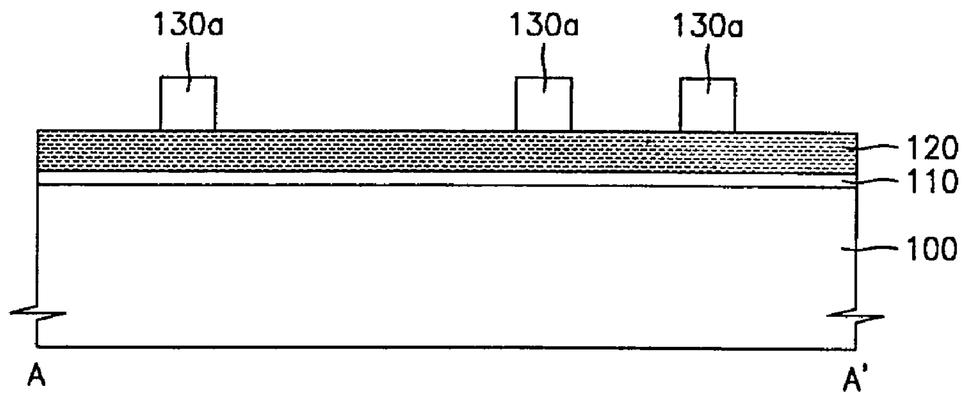

Referring to FIG. 3, a buffer layer pattern 130*a* is formed by patterning the buffer layer 130 using a conventional photolithography process. A shape of the buffer layer pattern 130*a* can vary according to a shape of the fins, such that a width of the buffer layer pattern 130*a* can be defined by considering a distance between adjacent fins, and a length of the buffer layer pattern 130*a* also can be defined by considering a length of the fin. A number of the buffer layer patterns 130*a* to be formed in an isolated active region may be defined by considering the number of fins to be formed. For example, the left buffer layer pattern 130*a* in FIG. 3 requires two fins to be formed, and the other two buffer layer patterns 130*a* on the right side of FIG. 3 require four fins to be formed.

Figure 4:
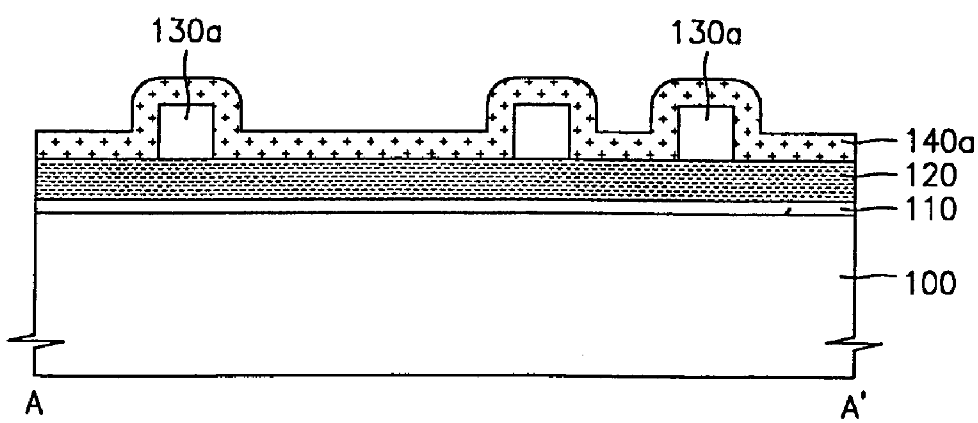

Referring to FIG. 4, a second hard mask layer 140 in a uniform thickness is formed on the first hard mask layer 120 and the buffer layer pattern 130*a* along steps. A thickness of the second hard mask layer 140 is defined by considering the width of the fins to be formed, preferably, the thickness is in a range of 300~500 Å, such as approximately 400 Å. Preferably, the second hard mask layer 140 is formed of a material having a large etch selectivity with respect to the first hard mask layer 120 since the second hard mask layer 140 will be used as an etch mask for patterning the first hard mask layer 120. Also, it is preferable that the second hard mask layer 140 has a large etch selectivity with respect to the pad insulating layer 110. When the pad insulating layer 110 is formed of a silicon thermal oxide and the first hard mask layer 120 is formed of a silicon nitride film, the second hard mask layer 140 can be formed of a polysilicon film.

Figure 5:
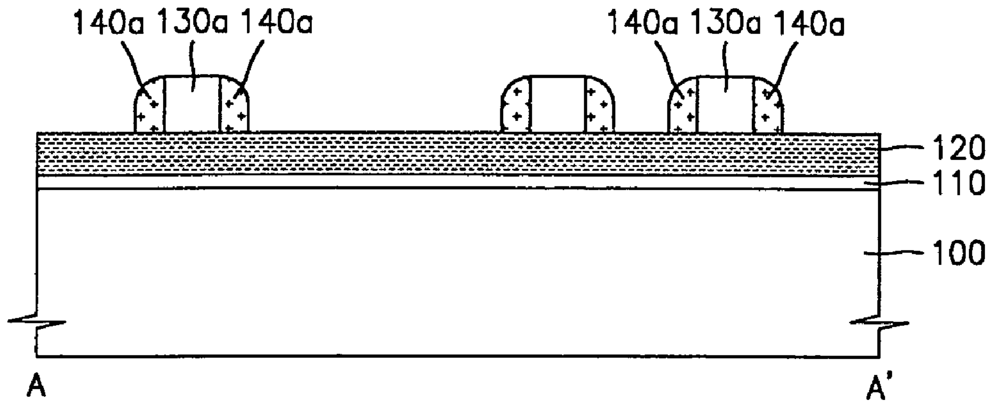

Referring to FIG. 5, a second hard mask layer pattern 140 is patterned such as to form spacers 140*a* on sidewalls of the buffer layer pattern 130*a*. The spacers can be formed by a conventional spacer forming process. For example, in case of the second hard mask layer 140 having a width of approximately 400 Å, polysilicon patterns 140*a* remain as the spacers of the buffer layer patterns 130*a*.

Figure 6:
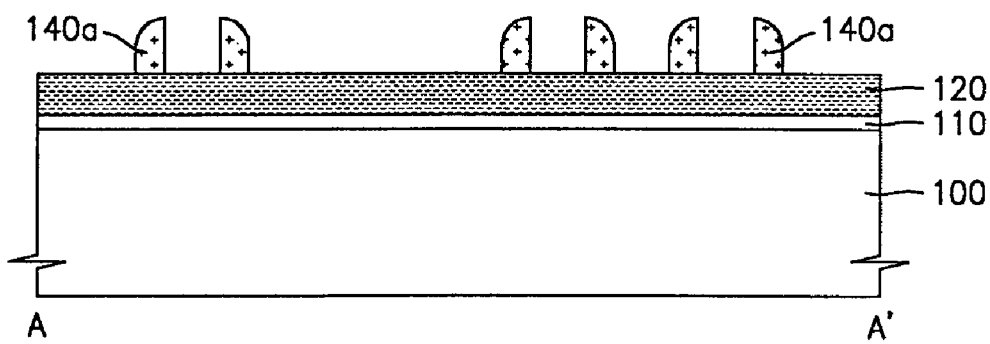

Referring to FIG. 6, a process is performed for removing the buffer layer pattern 130*a* between the second hard mask layer patterns 140*a*. The buffer layer pattern 130*a* can be removed by a commonly used conventional method. For example, when the buffer layer pattern 130*a* is formed of silicon oxide, it can be removed by a wet etching process using an oxide film etchant such as a Buffered Oxide Etchant (BOE). As a result, only the second hard mask layer patterns 140*a* remain on the first hard mask layer 120 as depicted in FIG. 6.

Figure 7:
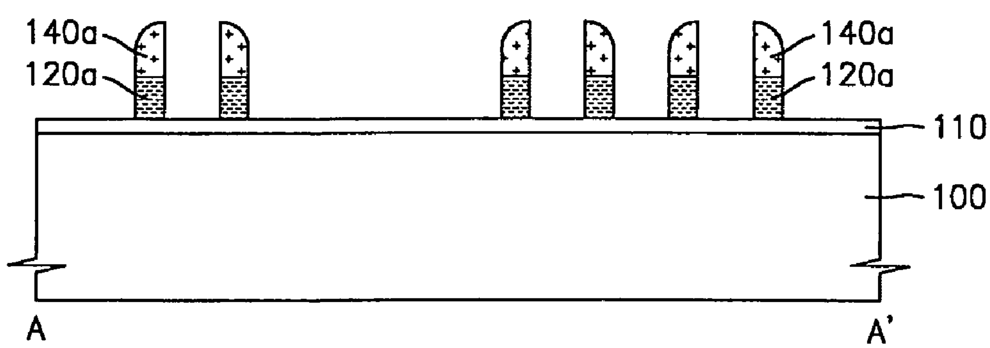

Referring to FIG. 7, a first hard mask layer pattern 120*a* having the same width as the second hard mask layer pattern 140*a* is formed by etching the first hard mask layer 120 using the second hard mask layer pattern 140*a* as etch masks. Preferably, the etching can be performed by an anisotropic dry etching method. In the above example case, the width of the first hard mask layer pattern 120*a* is approximately 400 Å.

Figure 8:
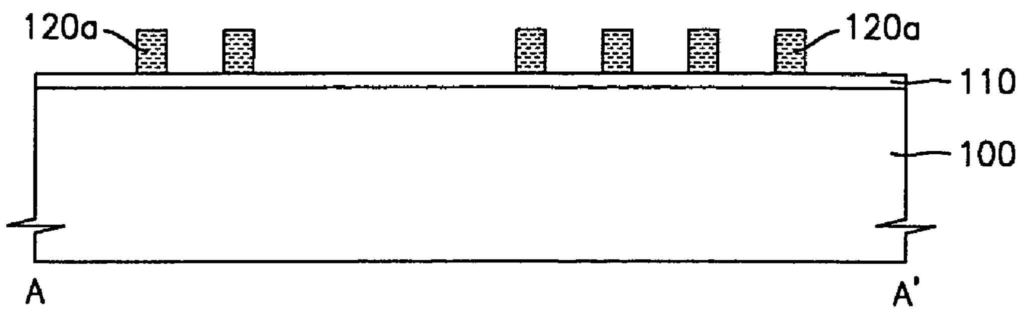

A resultant product after removing the second hard mask layer pattern 140*a* is depicted in FIG. 8. The second hard mask layer pattern 140*a* can be removed by using a conventional method such as a wet etching method, an anisotropic dry etching method, or a chemical isotropic dry etching method.

Figure 9:
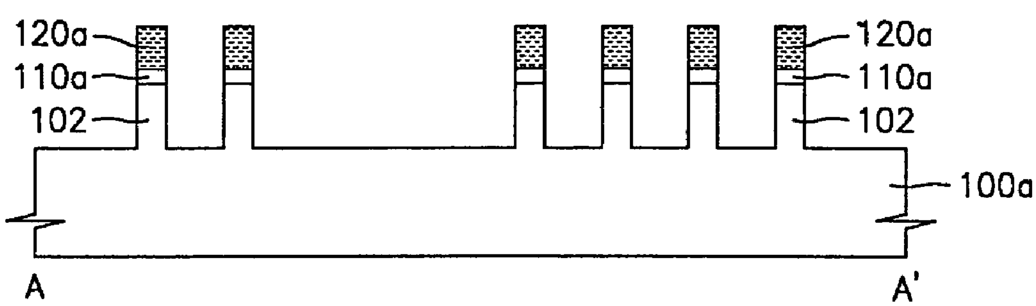

Referring to FIG. 9, an etching process is formed for forming the fins 102. The pad insulating film 110 and silicon substrate 100 for forming fins 102 are sequentially etched by an anisotropic dry etching method using the first hard mask layer pattern 120*a* as etch masks. A height of the fins 102 can be controlled by controlling an etch amount. As a result of the etching, the semiconductor substrate 100*a* has a plurality of vertically protruding fins 102 having thereon pad oxide film patterns 110*a* that are left behind after the etching process.

Figure 10:
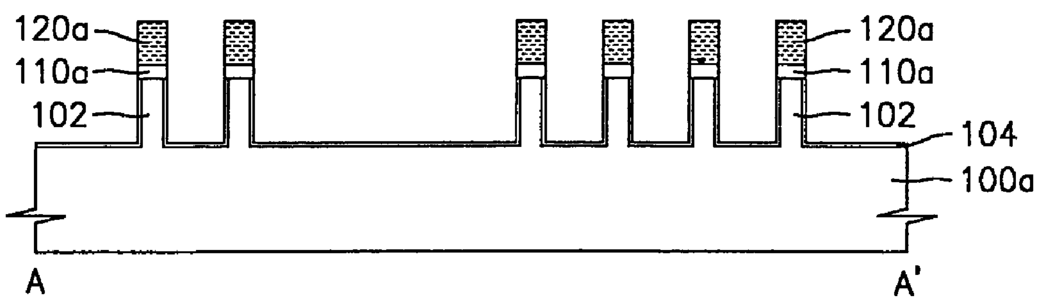

Referring to FIG. 10, the above resultant product is subject to a thermal oxidation process under an oxidation atmosphere containing oxygen. A thin thermal oxide film 104 is formed on the exposed surface of the substrate 100*a* including the side faces of the fins 102 as a result of the thermal oxidation. The thermal oxide film 104 will be used as an etch stopper in a following process.

Figure 11:
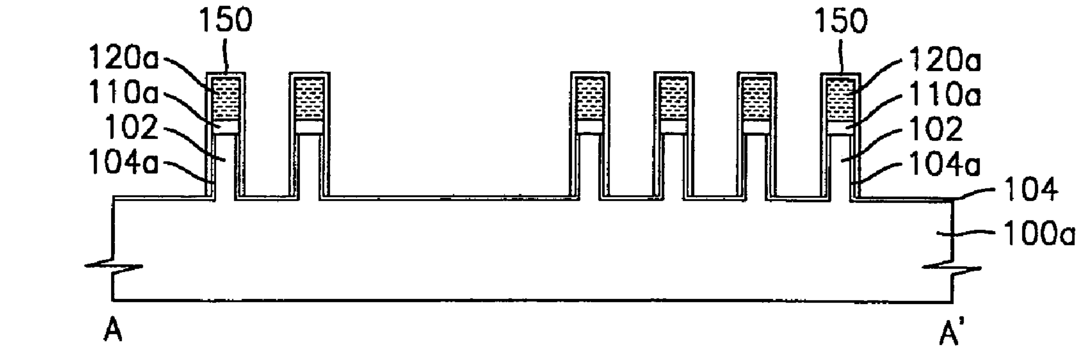

Referring to FIG. 11, a thermal oxidation blocking film (not shown) is formed of a material having a large selectivity with respect to the thermal oxide film 104, such as silicon nitride, along steps formed on the resultant product from the previous process. A thickness of the thermal oxidation blocking film need not be very thick because a purpose of the thermal oxidation blocking film is to protect the thermal oxide film 104 formed on the side faces of the fins 102 from thickening by an oxidation in a following process. Thermal oxidation blocking spacers 150 on side faces of the pad insulating film pattern 110*a* and the first hard mask layer pattern 120*a* including fins are formed by etching the thermal oxidation blocking film by using an etch back process or the like.

Figure 12:
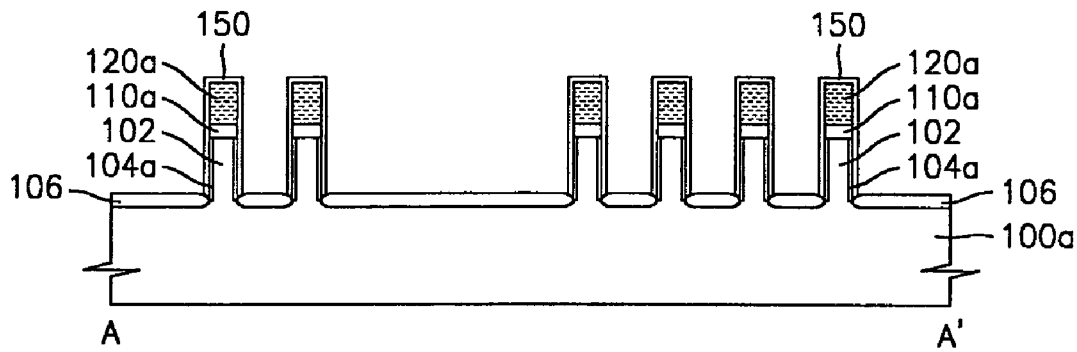

Referring to FIG. 12, a non-channel gate oxide film 106 is formed on the thermal oxide film 104 on which the thermal oxidation blocking spacers 150 are not formed. Preferably, the non-channel gate oxide film 106 is formed by performing a thermal oxidation process on the resultant product of FIG. 11. The non-channel gate oxide film 106 is formed thicker than the channel gate oxide film 180 (refer to FIG. 1) to avoid an unwanted channel formation on the substrate 100*a* under the non-channel gate oxide film 106 when a voltage of more than a threshold voltage is applied to the gate line 190. For example, the non-channel gate oxide film 106 can be formed to a thickness of about 300~1,000 Å, preferably approximately 500 Å.

Figure 13:
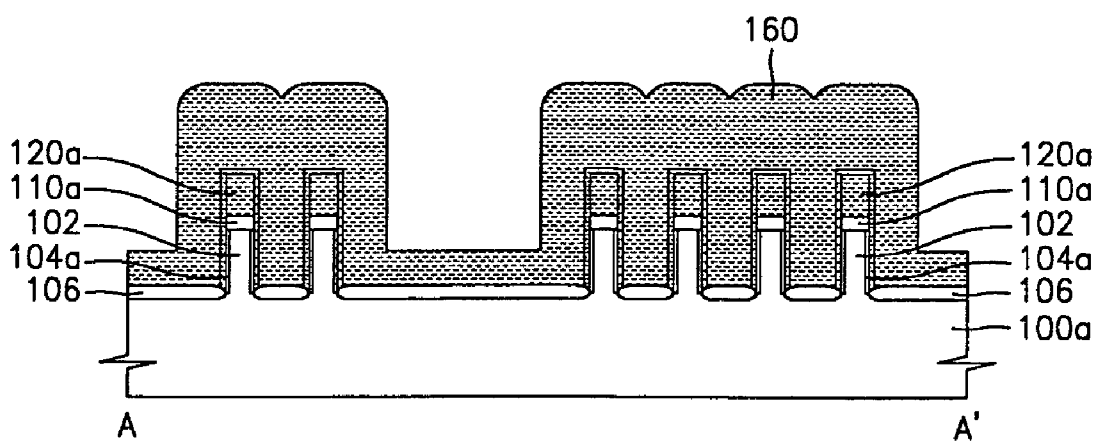

Referring to FIG. 13, a third mask layer 160 for forming a mask pattern is formed on the above resultant product. The third mask layer 160 is a film for masking the active region when etching the silicon substrate 100*a* to define a device isolation region on the substrate 100*a*. Therefore, the third mask layer 160 is preferably formed of a material having a large etch selectivity with respect to the non-channel gate oxide film 106 and to the silicon substrate 100*a*. The third mask layer 160 can be formed of silicon nitride. The third mask layer 160 is formed thicker than a height of the fins 102 by completely filling spaces for the active regions between the fins 102. However, if the spaces between the fins 102 are regions for forming device isolation trenches complete filling is not required.

Figure 14:
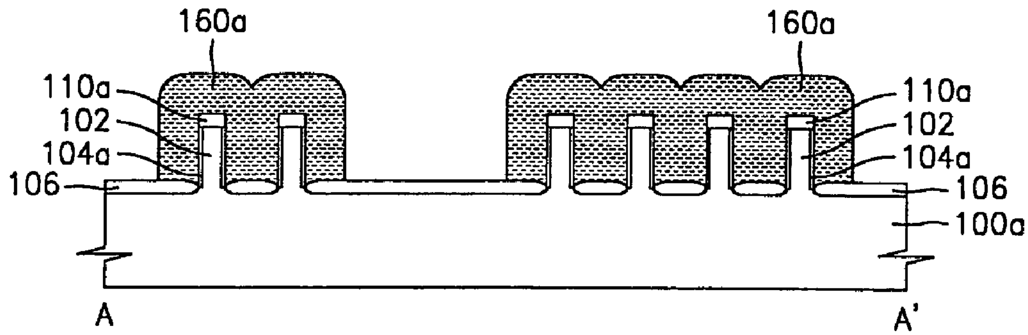

Referring to FIG. 14, the third mask layer 160 may be etched by an etch back process. The etching of the third mask layer 160 continues until surfaces of the non-channel gate oxide film 106 are exposed. At this time, the third mask layer pattern 160*a* remains only on the regions defined as the active regions after the back etching process because the thickness of the third mask layer 160 on the regions defined as the active regions is thicker than the region defined as the device isolation trench. FIG. 14 shows a case where the third mask layer pattern 160*a* includes the first hard mask layer pattern 120*a* and the thermal oxidation blocking spacers 150 since they are formed of the same material.

Figure 15:
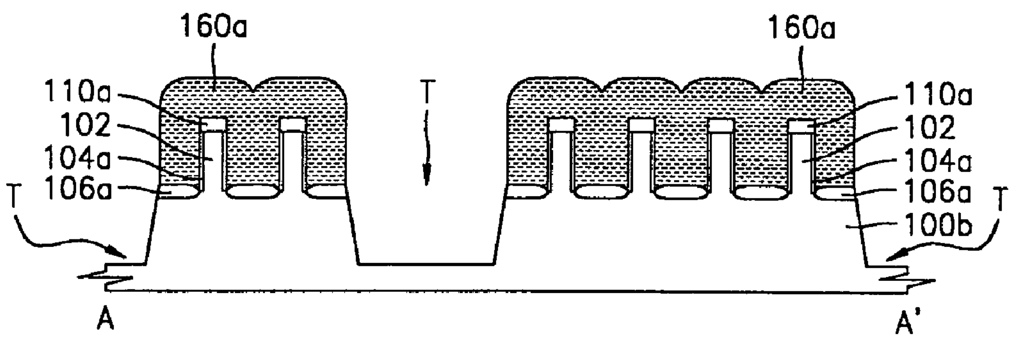

Referring to FIG. 15, the non-channel gate oxide film 106 and the silicon substrate 100*a* are sequentially etched using the third mask layer pattern 160*a* as an etch mask. The present step is for forming device isolation trenches T in the silicon substrate 100*a*. In some embodiments of the invention, the shallow isolation trenches (STI) are formed after forming the fins 102. Accordingly, the fins 102 and the STI films can be self aligned because the STI films are formed after masking the fins using the third mask layer pattern 160*a*.

Figure 16:
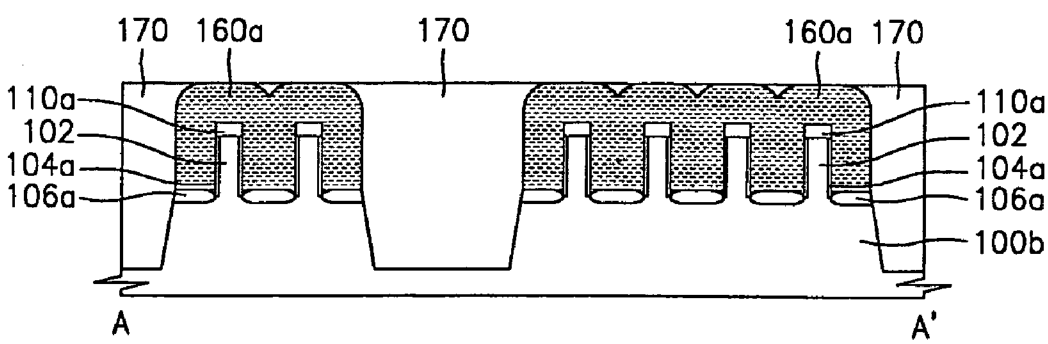

Referring to FIG. 16, the STI films are formed by filling the trenches T using an insulating material. For the insulating material for forming the STI films, silicon oxide having a superior gap filling characteristic such as a middle temperature oxide (MTO) film is used. Preferably, the silicon oxide film is formed thick enough to fill the trenches completely. A pad layer (not shown) such as the thermal oxide film used as a stress relief buffer layer can be formed on the exposed region for STI films on the silicon substrate 100*a* before filling the trenches with silicon oxide. After filling the trenches completely, the silicon oxide film is patterned until the third mask layer pattern 160*a* is exposed by an etch back process or a chemical mechanical polishing (CMP) process. Then, an insulating film 170 for forming the STI films is formed.

Figure 17:
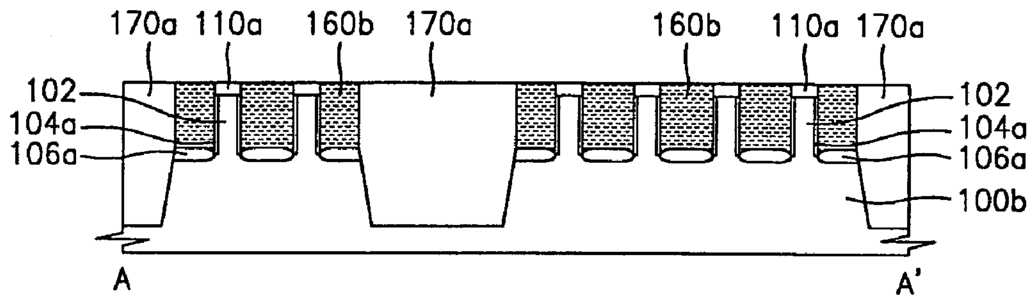

Referring to FIG. 17, an etching process for the third mask layer pattern 160*a* and the insulation film 170 is performed to decrease the height of the insulating film 170 for forming the STI films. Accordingly, the third mask layer pattern 160*a* and the insulating film 170 can be etched at the same time using an etch back process or a CMP process. Also, the insulating film 170 alone can be etched or the insulating film can be etched deeper than the third mask layer pattern 160*a* by using a gas or an etchant having a high etching rate with respect to the insulating film 170 for forming the STI films. This process may be omitted if the STI films 170*a* do not require a lower height than a height of the insulating film 170. As a result of the etching process, the STI films 170*a* are formed on the device isolation trenches T and portions of the third mask layer pattern 160*a* remain on the active regions.

Figure 18:
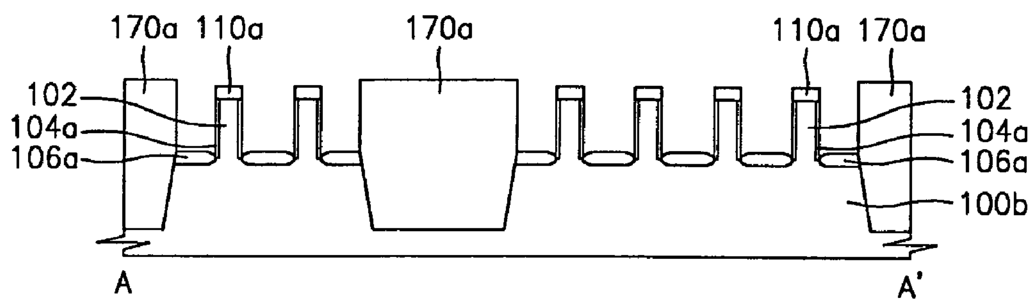

Referring to FIG. 18, the third mask layer pattern 160*a* is removed from the above product by using a conventional etching method. When the third mask layer pattern 160*a* is formed of silicon nitride, it can be removed by using a wet etching method or a dry etching method utilizing a large etch selectivity with respect to the surrounding oxides 104, 106*a*, and 110*a*.

Once the gate line 190 is formed by using a commonly used conventional method, a manufacturing process of the double gate field effect transistor depicted in FIG. 1B is completed. An exemplary method of manufacturing the gate line 190 is as follows.

Firstly, thermal oxide films 104 formed on a first side face and a second side face of fins 102 are removed by an etching process. The thermal oxide films 104 is removed before removing the non-channel gate oxide film 106*a* and the pad oxide film pattern 110*a* since the thermal oxide films 104 is thinner than the non-channel gate oxide film 106*a* and the pad oxide film pattern 110*a*. Afterward, channel gate oxide films 180 are formed on the first side face and the second side face of the fins 102 using a thermal oxidation process. The channel gate oxide film 180 can be formed with a thickness in a range of about 40~100 Å. After sequentially depositing a polysilicon film 192 and a metal silicide film 194 in spaces between the fins and on the fins 102, an insulating film 196, such as a nitride film, is deposited.

The metal silicide film 194 can be a tungsten silicide film. The gate line 190 depicted in FIGS. 1A and 1B can be obtained by sequentially patterning the insulating film 196, the metal silicide film 194, and the polysilcon film 192 by using a photolithography process.

A double gate field effect transistor according to embodiments of the invention does not use an expensive SOI substrate, and does not require a process for growing a silicon epitaxy layer, thereby reducing manufacturing costs and simplifying the manufacturing process.

The double gate field effect transistor according to embodiments of the invention prevents a degradation of an electrical characteristic of the transistor by forming a thick non-channel gate oxide film on the substrate on which no fins are formed to avoid a formation of an unwanted channel.

A double gate field effect transistor manufactured according to embodiments of the invention has a superior electrical characteristic because first and second gates of a double gate are formed simultaneously by self aligning, and also STI films are formed self aligned with the fins. The number of fins to be formed in separate active regions can be formed as required, and a height of the fins may be easily controlled.

Embodiments of the invention may be practiced in many ways. What follows are exemplary, non-limiting descriptions of some embodiments of the invention.

In accordance with some embodiments of the invention, the double gate field effect transistor includes a silicon substrate having active regions defined by device isolation regions and protruded fins on the active region wherein each fin has an upper face, a first side face, and a second side face, the first and second side faces facing each other, source regions and drain regions formed on both edges of the fins respectively, channel regions formed between the source regions and the drain regions on the substrate, channel gate oxide films formed on the first side faces and the second side faces, a pad insulating film pattern formed on the upper faces, a device isolation insulating film pattern that fills the device isolation region, non-channel gate oxide films formed on the active regions of the substrate where no protruding fins are formed, and a gate line formed on the gate oxide films, the pad insulating film pattern, and the non-channel gate oxide films.

The double gate field effect transistor according to some embodiments of the invention uses a bulk silicon substrate instead of a SOI substrate. The number of fins can be controlled as required. Since the first side face and the second side face of the fins are facing each other, the two gates are self-aligned, and also the fin and the STI films are self aligned, thereby improving an electrical characteristic of the transistor and simplifying the manufacturing process.

In the double gate field effect transistor according to some embodiments of the invention, the non-channel gate oxide film is more than twice as thick than the channel gate oxide film. The non-channel gate oxide film may have a thickness in a range of about 300~1,000 Å.

A method of manufacturing the double gate field effect transistor according to some embodiments of the invention includes forming a pad insulating layer on a semiconductor substrate, forming a first hard mask layer pattern on the pad insulating layer, forming a pad insulating layer pattern and fins by sequentially etching the pad insulating layer and the substrate using the first hard mask layer pattern as a etch mask, forming an non-channel gate oxide film on the substrate on which no protruding fins are formed, forming a second hard mask layer pattern that covers the fins and a portion of the non-channel gate oxide film on the substrate, forming trenches on the substrate by etching the non-channel gate oxide film and the substrate using the second hard mask layer pattern as an etch mask, forming device isolation insulating film patterns in the trenches, forming channel gate oxide films on the first side face and the second side face of the fins, and forming a gate line that surrounds the channel gate oxide film and the pad insulating layer pattern.

While this invention has been particularly shown and described with reference to preferred embodiments thereof, it will be understood by those skilled in the art that various changes in form and details may be made therein without departing from the spirit and scope of the invention as defined by the appended claims.

We claim:

1. A method of manufacturing a double gate field effect transistor, comprising:

forming a pad insulating layer on a semiconductor substrate;

forming a first hard mask layer pattern on the pad insulating layer;

forming a pad insulating layer pattern and fins by sequentially etching the pad insulating layer and the substrate using the first hard mask layer pattern as a etch mask;

forming an non-channel gate oxide film on the substrate in areas where no fins are formed;

forming a second hard mask layer pattern that covers the fins and a portion of the non-channel gate oxide film on the substrate;

forming trenches on the substrate by etching the non-channel gate oxide film and the substrate using the second hard mask layer pattern as an etch mask;

forming device isolation insulating film patterns in the trenches;

forming channel gate oxide films on the first side face and the second side face of the fins; and forming a gate line that surrounds the channel gate oxide film and the pad insulating layer pattern.

2. The method of claim 1, wherein forming the pad insulating layer on the semiconductor substrate comprises forming the pad insulating layer on a bulk silicon substrate.

3. The method of claim 1, wherein the forming the first hard mask layer pattern comprises:

sequentially forming a first hard mask layer and a buffer insulating layer on the pad insulating layer;

forming a buffer insulating layer pattern by patterning the buffer insulating layer;

forming a third hard mask layer pattern having the same shape as the first hard mask layer pattern on side walls of the buffer insulating layer pattern;

removing the buffer insulating layer pattern;

forming the first hard mask layer pattern by etching the first hard mask layer using the third hard mask layer pattern as an etch mask; and removing the third hard mask layer pattern.

4. The method of claim 3, wherein forming the pad insulating layer comprises forming the pad insulating layer of silicon oxide, wherein forming the first hard mask layer pattern comprises forming the first hard mask layer pattern of silicon nitride, and wherein forming the third hard mask layer pattern comprises forming the third hard mask layer pattern of polysilicon.

5. The method of claim 1, wherein forming the non-channel gate oxide film comprises forming the non-channel gate oxide film of silicon oxide.

6. The method of claim 5, wherein forming the non-channel gate oxide film further comprises:

forming a silicon oxide film on the semiconductor substrate and on the fins;

forming a silicon nitride film spacer on the first side face and the second side face of the fins, covering the silicon oxide film; and forming the non-channel gate oxide film by thermally oxidizing the silicon oxide film where the silicon nitride film spacer is not present.

7. The method of claim 6, wherein forming the non-channel gate oxide film further comprises forming the non-channel gate oxide film of a thickness in a range of 300~1,000 Å.

8. The method of claim 6, further comprising removing the silicon oxide film formed on the first and the second side faces of the fins before forming the channel gate oxide film.

9. The method of claim 1, wherein forming the second hard mask layer pattern comprises forming the second hard mask layer pattern of silicon nitride.

10. The method of claim 1, wherein forming the second hard mask layer pattern comprises:

forming a second hard mask layer by completely filling spaces between neighboring fins along a step on a surface of the non-channel gate oxide film; and patterning the second hard mask layer to form trenches exposing the non-channel gate oxide film.

11. The method of claim 1, wherein forming the device isolation insulating film pattern comprises:

forming a device isolation insulating film to fill the trenches and to cover the second hard mask layer pattern; and forming the device isolation insulating film pattern by etching the device isolation insulating film and the second hard mask layer pattern.

12. The method of claim 1, wherein forming the device isolation insulating film pattern comprises:

forming a device isolation insulating film to fill the trench and to cover the second hard mask layer pattern; and forming the device isolation insulating film pattern by etching the device isolation insulating film.

13. The method of claim 1, wherein forming the gate line comprises forming the gate line of a polysilicon film, a metal silicide film, and a silicon nitride film.

* * * * *

UNITED STATES PATENT AND TRADEMARK OFFICE

CERTIFICATE OF CORRECTION

PATENT NO. : 7,015,106 B2 
APPLICATION NO. : 10/917026
DATED : March 21, 2006
INVENTOR(S) : Yoon et al.

It is certified that error appears in the above-identified patent and that said Letters Patent is hereby corrected as shown below:

On the Title Page, under item 56 Other Publications, please replace “50-m” with --50-mn--

On the Title Page, under item 56 References Cited, please replace “6,770,516 B1” with --6,770,516 B2--

On the Title Page, under item 56 References Cited, please replace “6,838,322 B1” with --6,838,322 B2--

Column 1, line 34, please replace “affect,” with --affect--

Signed and Sealed this

Twentieth Day of February, 2007

JON W. DUDAS
*Director of the United States Patent and Trademark Office*